(12) United States Patent
Lee et al.

(10) Patent No.: US 9,166,186 B2
(45) Date of Patent: Oct. 20, 2015

(54) METHODS OF FORMING ORGANIC LIGHT EMITTING STRUCTURES AND METHODS OF MANUFACTURING ORGANIC LIGHT EMITTING DISPLAY DEVICES

(75) Inventors: Dong-Won Lee, Yongin (KR); Hyea-Weon Shin, Yongin (KR)

(73) Assignee: Samsung Display Co., Ltd., Giheung-Gu, Yongin-si, Gyeonggi-Do (KR)

(*) Notice: Subject to any disclaimer, the term of this patent is extended or adjusted under 35 U.S.C. 154(b) by 434 days.

(21) Appl. No.: 13/587,571

(22) Filed: Aug. 16, 2012

(65) Prior Publication Data

US 2013/0109117 A1 May 2, 2013

(30) Foreign Application Priority Data

Oct. 28, 2011 (KR) .................. 10-2011-0111185

(51) Int. Cl.
*H01L 21/00* (2006.01)
*H01L 21/40* (2006.01)
*H01L 51/50* (2006.01)
*H01L 27/32* (2006.01)
*H01L 51/00* (2006.01)

(52) U.S. Cl.
CPC ........ *H01L 51/5056* (2013.01); *H01L 27/3246* (2013.01); *H01L 51/5088* (2013.01); *H01L 51/0018* (2013.01)

(58) Field of Classification Search
CPC ............ H01L 27/3213; H01L 51/5012; H01L 2251/566; H01L 51/0023; H01L 51/5056; H01L 51/5088; H01L 51/5072; H01L 51/5092

USPC .................... 438/26, 29, 34, 46, 99, 705, 82; 257/E21.123

See application file for complete search history.

(56) References Cited

U.S. PATENT DOCUMENTS

| 2005/0189874 A1* | 9/2005 | Park et al. ..................... 313/504 |
| 2009/0136856 A1* | 5/2009 | Lin et al. ........................... 430/5 |
| 2010/0227047 A1* | 9/2010 | Chiang et al. ................... 427/66 |
| 2011/0084286 A1* | 4/2011 | Park et al. ....................... 257/79 |
| 2012/0319089 A1* | 12/2012 | Shin et al. ....................... 257/40 |

FOREIGN PATENT DOCUMENTS

| JP | 2011-60518 | 3/2011 |
| KR | 10-2008-0060710 | 7/2008 |

* cited by examiner

*Primary Examiner* — Mohsen Ahmadi
(74) *Attorney, Agent, or Firm* — Robert E. Bushnell, Esq.

(57) ABSTRACT

In a method of forming an organic light emitting structure, a plurality of first electrodes spaced apart from each other is formed on a lower substrate. A first organic layer covering the first electrodes is formed on the lower substrate. A preliminary pixel defining layer is formed on the first organic layer. The preliminary pixel defining layer includes a photosensitive material, and is selectively exposed to light so that the preliminary pixel defining layer and a portion of the first organic layer beneath the preliminary pixel defining layer are transformed into a pixel defining layer and a first organic layer pattern, respectively. An emitting layer is formed on the first organic layer exposed by the pixel defining layer. A second organic layer is formed on the emitting layer. A second electrode is formed on the second organic layer.

24 Claims, 9 Drawing Sheets

METHODS OF FORMING ORGANIC LIGHT EMITTING STRUCTURES AND METHODS OF MANUFACTURING ORGANIC LIGHT EMITTING DISPLAY DEVICES

CLAIM OF PRIORITY

This application makes reference to, incorporates the same herein, and claims all benefits accruing under 35 U.S.C. §119 from an application earlier filed in the Korean Intellectual Property Office on the 28 Oct. 2011 and there duly assigned Serial No. 10-2011-0111185.

BACKGROUND OF THE INVENTION

1. Field of the Invention

The present invention relates to methods of forming organic light emitting structures and methods of manufacturing organic light emitting display devices. More particularly, the invention relates to organic light emitting structures including a pixel defining layer and organic layers, and methods of manufacturing organic light emitting display devices including a pixel defining layer and organic layers.

2. Description of the Related Art

An organic light emitting display (OLED) device may display desired information such as images, letters and/or characters using a light generated by the combination of holes provided from an anode and electrons provided from a cathode in an organic layer thereof. The OLED device may have several advantages, such as wide viewing angle, high response time, thin thickness and low power consumption, so that the OLED device may be widely employed in various electrical and electronic apparatuses. Recently, the OLED device has been rapidly developed as one of the most promising display devices.

As for a conventional process, organic layers, including, e.g., a hole transport layer, an organic emitting layer, an electron transport layer, etc., may be patterned per each pixel region. For example, a pixel defining layer (PDL) may be formed, and the organic layers may be formed on an electrode exposed by the PDL and on a sidewall of the pixel defining layer by, e.g., a printing process or a transfer process.

However, when the organic layers having different materials and characteristics relative to each other make contact with a sidewall of the PDL, the organic layers may not be formed uniformly on the sidewall of the PDL so as to cause, e.g., a deviation of thickness of the organic layers near the sidewall of the PDL. Accordingly, leakage current may be generated near the sidewall of the PDL and distributions of luminescence characteristics of the OLED device in each pixel region may become irregular.

SUMMARY OF THE INVENTION

The present invention provides a method of forming an organic light emitting structure ensuring improved luminescence characteristics.

The invention also provides a method of manufacturing an organic light emitting display device including an organic light emitting structure to ensure improved luminescence characteristics.

According to the present invention, there is provided a method of forming an organic light emitting structure. In the method, a plurality of first electrodes spaced apart from each other is formed on a lower substrate. A first organic layer covering the first electrodes is formed on the lower substrate. A preliminary pixel defining layer is formed on the first organic layer. The preliminary pixel defining layer includes a photosensitive material. The preliminary pixel defining layer is selectively exposed to light so that the preliminary pixel defining layer and a portion of the first organic layer beneath the preliminary pixel defining layer are transformed into a pixel defining layer and a first organic layer pattern, respectively. An emitting layer is formed on the first organic layer exposed by the pixel defining layer. A second organic layer is formed on the emitting layer. A second electrode is formed on the second organic layer.

In exemplary embodiments of the invention, a remaining portion of the first organic layer except for the first organic layer pattern may be defined as a second organic layer pattern. The first organic layer pattern may have hole transport or hole injection capabilities less than those of the second organic layer pattern.

In the exemplary embodiments, the preliminary pixel defining layer may further include a photoinitiator. The first organic layer pattern may be formed by active species that are generated by the photoinitiator and diffused into the first organic layer. The first organic layer pattern may include a polymer cross-linked or polymerized by the active species.

In the exemplary embodiments, the pixel defining layer may include the cured or hardened photosensitive material of the preliminary pixel defining layer. The pixel defining layer may have a surface energy less than those of the preliminary pixel defining layer, the first organic layer, the emitting layer and the second organic layer.

According to the exemplary embodiments, there is provided a method of forming an organic light emitting structure. In the method, a plurality of first electrodes spaced apart from each other is formed on a lower substrate. A hole transport layer covering the first electrodes is formed on the lower substrate. A preliminary pixel defining layer is formed on the hole transport layer. The preliminary pixel defining layer includes a photosensitive material. The preliminary pixel defining layer is selectively exposed to light so that the preliminary pixel defining layer and a portion of the hole transport layer beneath the preliminary pixel defining layer are transformed into a pixel defining layer and a first hole transport layer pattern, respectively. An emitting layer is formed on the hole transport layer exposed by the pixel defining layer. An electron transport layer is formed on the emitting layer. A second electrode is formed on the electron transport layer.

In the exemplary embodiments, a remaining portion of the hole transport layer except for the first hole transport layer pattern may be defined as a second hole transport layer pattern. The first hole transport layer pattern may have a hole transport capability or an electrical conductivity less than those of the second hole transport layer pattern.

In the exemplary embodiments, at least one of the preliminary pixel defining layer and the hole transport layer may include a photoinitiator. The hole transport layer may include a hole transport material and a photosensitive monomer. The first hole transport layer pattern may include a polymer produced by cross-linking or polymerization reactions of the photosensitive monomer. The cross-linking or polymerization reactions may be induced by active species generated by the photoinitiator.

In the exemplary embodiments, a hole injection layer may be additionally formed before forming the hole transport layer. A portion of the hole injection layer beneath the first hole transport layer pattern may be transformed into a first hole injection layer pattern. The hole injection layer may include a hole injection material and a photosensitive monomer. The first hole injection layer pattern may include a polymer produced by cross-linking or polymerization reactions of the photosensitive monomer. The cross-linking or polymerization reactions may be induced by active species generated by the photoinitiator.

In the exemplary embodiments, a remaining portion of the hole injection layer except for the first injection layer pattern may be defined as a second injection layer pattern. The first hole injection layer pattern may have a hole injection capability or an electrical conductivity less than those of the second injection layer pattern.

In the exemplary embodiments, the hole injection layer may include a hole injection material and a photoinitiator.

The first hole injection layer pattern may include active species generated by the photoinitiator.

According to the exemplary embodiments, there is provided a method of manufacturing an organic light emitting display device. In the method, a lower structure is formed on a lower substrate. The lower structure may include a switching device and an insulation layer. A first electrode electrically connected to the switching device is formed on the lower structure. A first organic layer covering the first electrode is formed on the lower structure. A preliminary pixel defining layer is formed on the first organic layer. The preliminary pixel defining layer includes a photosensitive material. The preliminary pixel defining layer is selectively exposed to light so that the preliminary pixel defining layer and a portion of the first organic layer beneath the preliminary pixel defining layer are transformed into a pixel defining layer and a first organic layer pattern, respectively. An emitting layer is formed on the first organic layer exposed by the pixel defining layer. A second organic layer is formed on the emitting layer. A second electrode is formed on the second organic layer.

In the exemplary embodiments, at least one of the preliminary pixel defining layer and the first organic layer may include a photoinitiator. The first organic layer may include a hole transport material and a photosensitive monomer. The first organic layer pattern may include a polymer produced by cross-linking or polymerization reactions of the photosensitive monomer. The cross-linking or polymerization reactions may be induced by active species generated by the photoinitiator. A remaining portion of the first organic layer, except for the first organic layer pattern, may be defined as a second organic layer pattern. The first organic layer pattern may have a hole transport capability or an electrical conductivity less than those of the second organic layer pattern.

In the exemplary embodiments, the second organic layer may include an electron transport layer. The electron transport layer may be formed on the emitting layer and a sidewall of the pixel defining layer. However, the electron transport layer may not be formed on a top surface of the pixel defining layer.

In the exemplary embodiments, the second organic layer may include an electron transport layer. The electron transport layer may cover the pixel defining layer and the emitting layer.

In the exemplary embodiments, the switching device may include a thin film transistor or an oxide semiconductor device.

In the exemplary embodiments, the pixel defining layer may include the cured or hardened photosensitive material of the preliminary pixel defining layer. The pixel defining layer may have a surface energy less than those of the preliminary pixel defining layer, the first organic layer, the emitting layer and the second organic layer.

According to the exemplary embodiments, a first organic layer including, e.g., a hole injection layer and a hole transport layer may be formed on a whole surface of a lower substrate, and then a PDL may be formed on the first organic layer. An emitting layer may be selectively formed in a pixel region defined by the PDL. Accordingly, a leakage current or deviations of various luminescence characteristics near a sidewall of the PDL may be decreased because the PDL may be formed on the first organic layer. Additionally, an exposure process may be performed selectively on the PDL so that hole transport or hole injection capabilities and an electrical conductivity of a portion of the first organic layer under the PDL may be decreased. Therefore, crosstalk between adjacent pixel regions may be prevented and an OLED device having improved luminescence characteristics, e.g., resolution, contrast, etc., may be obtained.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Various exemplary embodiments will be described more fully hereinafter with reference to the accompanying drawings, in which some exemplary embodiments are shown. The invention may, however, be embodied in many different forms and should not be construed as limited to the exemplary embodiments set forth herein. Rather, these exemplary embodiments are provided so that this description will be thorough and complete, and will fully convey the scope of the invention to those skilled in the art. In the drawings, the sizes and relative sizes of layers and regions may be exaggerated for clarity.

It will be understood that, when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe the relationship of one element or feature to another element or feature (or other elements or features) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

The terminology used herein is for the purpose of describing particular exemplary embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

FIGS. 1 through 3, 4A, 4B, 5A, 5B, 6, 7A and 7B are cross-sectional views illustrating a method of forming an organic light emitting structure in accordance with the exemplary embodiments of the invention.

Figure 1:
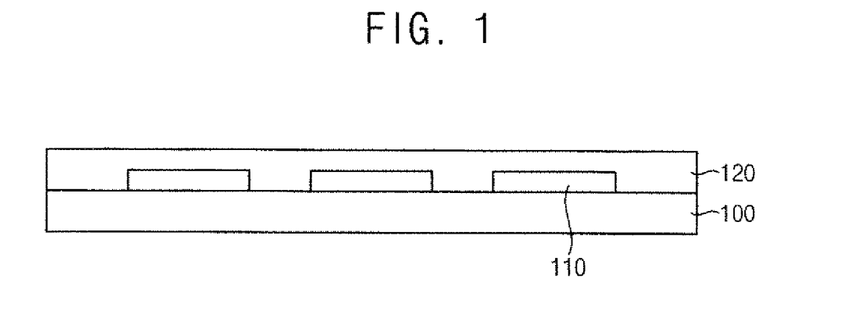
FIGS. 1 through 3, 4A, 4B, 5A, 5B, 6, 7A and 7B are cross-sectional views illustrating a method of forming an organic light emitting structure in accordance with the exemplary embodiments of the invention.

Referring to FIG. 1, a plurality of first electrodes 110 may be formed on a substrate 100. The substrate 100 may include a lower structure (not illustrated) such as a switching device, an insulation layer, etc. A first organic layer 120 covering the first electrodes 110 may be formed on the substrate 100.

Each first electrode 110 may be formed on the substrate 100 including the lower structure. Each first electrode 110 may serve as a transparent electrode or a reflective electrode according to the type of OLED device including the organic light emitting structure, for example, a top-emission type or a back-emission type.

When the first electrode 110 serves as the transparent electrode, the first electrode 110 may be formed using a transparent conductive material that may have a relatively large work function, for example, indium tin oxide (ITO), zinc tin oxide (ZTO), indium zinc oxide (IZO), zinc oxide ($ZnO_x$), tin oxide ($SnO_x$), gallium indium zinc oxide (GIZO), aluminum-doped zinc oxide (AZO), etc. These may be used alone or in a combination thereof.

If the first electrode 110 serves as the reflective electrode, the first electrode 110 may be formed using a metal such as silver (Ag), aluminum (Al), platinum (Pt), gold (Au), chromium (Cr), tungsten (W), molybdenum (Mo), titanium (Ti), palladium (Pd), etc., or an alloy of these metals. In one exemplary embodiment, the first electrode 110 may have a multi-stacked structure including a first layer and a second layer. The first layer may include, e.g., the above metal or the alloy, and the second layer may include, e.g., the above transparent conductive material. In this case, the first electrode 110 may serve as a semi-transparent electrode. In exemplary embodiments, the first electrode 110 may serve as an anode providing holes to the first organic layer 120.

The first organic layer 120 may include a hole transport layer (HTL). The HTL may be formed using a hole transport material, for example, 4,4'-bisbiphenyl (NPB), N,N'-diphenyl-N,N'-bis(3-methylphenyl)-1,1'-biphenyl-4,4-diamine (TPD), N,N'-di-1-naphtyl-N,N'-diphenyl-1,1'-biphenyl-4,4'-diamine (NPD), N-phenylcarbazole, polyvinylcarbazole or a mixture of these materials. The HTL may be obtained by a vacuum evaporation process, a thermal evaporation process, a slit coating process, a spin coating process, a printing process, etc. In exemplary embodiments, the HTL may be deposited or coated on a whole surface of the substrate 100 so as to cover the plurality of the first electrodes 110.

The first organic layer 120 may further include a hole injection layer (HIL) beneath the HTL. The HIL may facilitate a hole injection from the first electrode 110 to the HTL. The HIL may be formed using a hole injection material, for example, cupper phthalocyanine (CuPc), poly(3,4)-ethylenedioxythiophene (PEDOT), polyaniline (PANI) or a mixture of these materials. The HIL may be obtained by a vacuum evaporation process, a thermal evaporation process, a slit coating process, a spin coating process, a printing process, etc. In exemplary embodiments, the HIL may be formed on a whole surface of the substrate 100 so as to cover the plurality of first electrodes 110.

In exemplary embodiments, the HTL and/or the HIL may further include a photoinitiator in addition to the hole transport material and the hole injection material, respectively. The photoinitiator may include photo-sensitive or photo-amplifying materials that may produce active species including an acid, a base or a radical induced by light irradiation. Examples of the photoinitiator may include acetophenone derivatives, benzophenone derivatives, triazine derivatives, biimidazole-based or oxime ester-based materials, etc. These may be used alone or in a mixture thereof. Non-limiting examples of the acetophenone derivatives may include 2,2'-diethoxy acetophenone, 2,2'-dibutoxy acetophenone, p-t-butyl trichloro acetophenone, 4-chloro acetophenone, etc. Non-limiting examples of the benzophenone derivatives may include 4,4'-dimethylamino benzophenone, 4,4'-dichloro benzophenone, 3,3'-dimethyl-2-methoxy benzophenone, hydroxy benzophenone, acrylated benzophenone, 4-phenyl benzophenone, etc. Non limiting examples of the triazine derivatives may include 2,4,6-trichloro-s-triazine, 2-phenyl- 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, etc.

In exemplary embodiments, the HTL and/or the HIL may further include a photosensitive monomer. The photosensitive monomer may include a material that may be cross-linked and/or polymerized by the active species generated by the photoinitiator. For example, the photosensitive monomer may include a negative type photosensitive material.

The photosensitive monomer may include, e.g., an acrylate-based material, a methacrylate-based material, an aromatic olefin-based material or a benzene-based material having a vinyl group. For example, the photosensitive monomer may include 1,4-butanediol acrylate, 1,3-butylene glycol diacrylate, 1,6-hexanediol diacrylate, diethylene glycol diacrylate, ethylene glycol diacrylate, triethylene glycol diacrylate, polyethylene glycol diacrylate, neopentyl glycol diacrylate, propylene glycol diacrylate, dipropylene glycol diacrylate, sorbitol triacrylate, bisphenol A diacrylate derivatives, pentaerythritol triacrylate, pentaerythritol tetraacrylate, pentaerythritol diacrylate, dipentaerythritol pentaacrylate, dipentaerythritol hexaacrylate, trimethyl propane ethoxy triacrylate or methacrylates of these materials. These may be used alone or in a mixture thereof.

Figure 2:
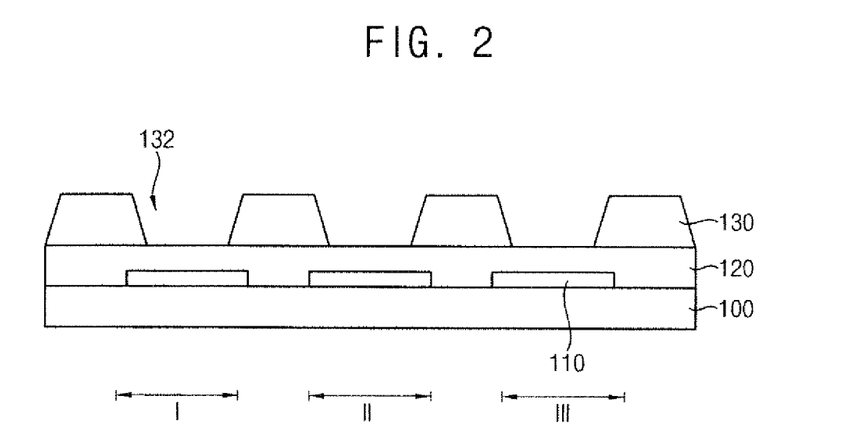

Referring to FIG. 2, a plurality of preliminary pixel defining layers (PDLs) 130 may be formed on the first organic layer 120. Pixel regions I, II and III of an OLED device may be defined by the preliminary PDLs. A remaining region of the OLED device, except for the pixel regions I, II and III, may be defined as a non-pixel region. Each of the pixel regions I, II and III may substantially overlap at least a portion of the first electrode 110. Openings 132 exposing portions of the first organic layer 120 in the pixel regions I, II and III may be also defined by the preliminary PDLs 130.

In exemplary embodiments, the preliminary PDL 130 may include a photosensitive material that may be cured or hardened by heat and/or light. The photosensitive material may include acrylate-based resin, polyacrylate-based resin, polyimide-based resin, benzocyclobutene (BCB), etc. In some exemplary embodiments, the preliminary PDL 130 may include a polymer having fluorinated carbon atoms, for example, fluorinated polyimide, fluorinated polyester, etc. In some exemplary embodiments, the preliminary PDL 130 may include an organosilane-based material, for example, siloxane, silsesquioxane, etc. These may be used alone or in a mixture thereof.

In exemplary embodiments, the preliminary PDL 130 may be formed selectively on predetermined regions of the first organic layer 120 by an inkjet printing process, a nozzle printing process, an offset imprinting process, a reverse offset imprinting process, a transfer process such as a laser induced thermal imaging (LITI) process, etc.

In exemplary embodiments, the inkjet or nozzle printing processes may include soluble processes. For example, the photosensitive material may be mixed with a suitable solvent and a resultant mixture may be coated selectively on the predetermined regions of the first organic layer 120 through nozzles of inkjet printing or nozzle printing apparatuses. An additional drying process may be performed to remove the solvent.

Alternatively, the inkjet or nozzle printing processes may include insoluble processes. For example, the photosensitive material may be mixed with a suitable solvent and a resultant mixture may be introduced into the nozzles of the inkjet printing or nozzle printing apparatuses. The nozzle may be heated so that the photosensitive material may be vaporized or sublimated. The vaporized or sublimated photosensitive material may be coated on the predetermined regions of the first organic layer 120 through the nozzles. In this case, the solvent-free photosensitive material may be printed on the first organic layer 120, and thus an additional drying process may not be required.

In some exemplary embodiments, the preliminary PDL 130 may be formed by a patterning process including an exposure process. For example, a photosensitive composition, including a precursor such as a polyacrylate-based resin precursor or a polyimide-based resin precursor and a solvent, may be deposited or coated on the first organic layer 120. Non-pixel regions may be selectively exposed to light so as to induce polymerization of the precursor, and then a developing process may be performed to form the preliminary PDL 130.

In exemplary embodiments, the preliminary PDL 130 may further include a photoinitiator. As described above, the photoinitiator may include acetophenone derivatives, benzophenone derivatives, triazine derivatives, biimidazole-based or oxime ester-based materials, etc. These may be used alone or in a mixture thereof.

Figure 3:
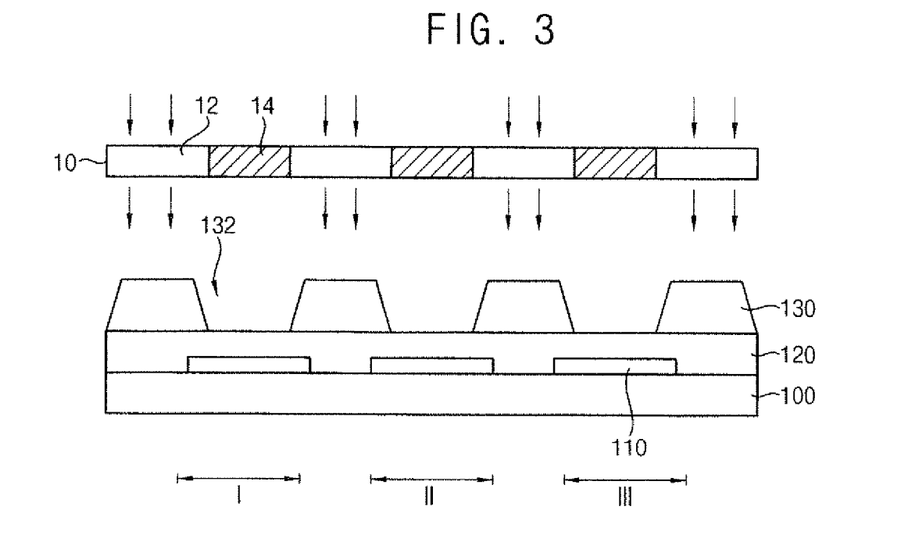

Referring to FIG. 3, a selective exposure process may be performed on the preliminary PDL 130. Accordingly, the preliminary PDL 130 may be cured or hardened so as to be transformed into a PDL 135.

In exemplary embodiments, a mask 10 may be disposed over the preliminary PDL 130 and the first organic layer 120. The mask 10 may include a transparent portion 12 and a blocking region 14. The transparent region 12 of the mask 10 may substantially overlap the preliminary PDL 130 in the non-pixel region, and the blocking region 14 of the mask 10 may substantially overlap a portion of the first organic layer 120 in each of the pixel regions I, II and III.

The preliminary PDL 130 may be selectively exposed using a light source (not illustrated) located over the mask 10. In exemplary embodiments, the light source may include an ultraviolet source such as an eximer source, a KrF source, an ArF source, etc., or a laser source.

Figure 7A:
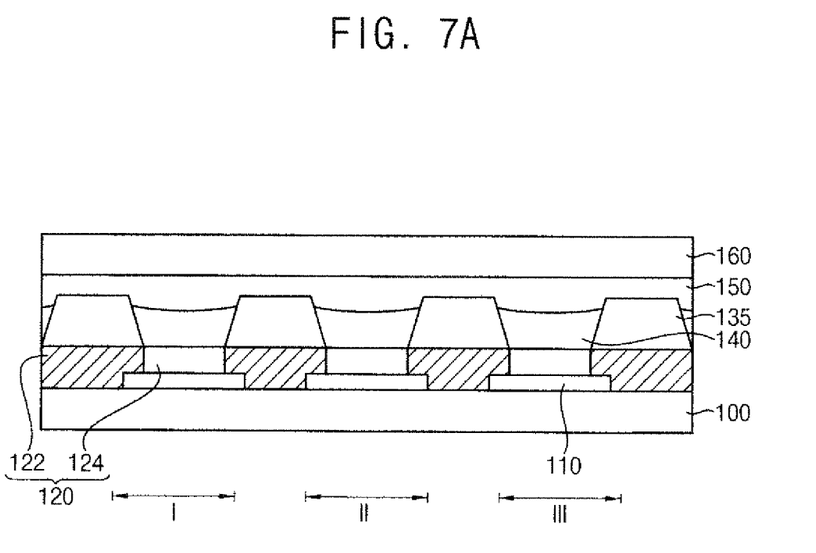
Figure 7B:
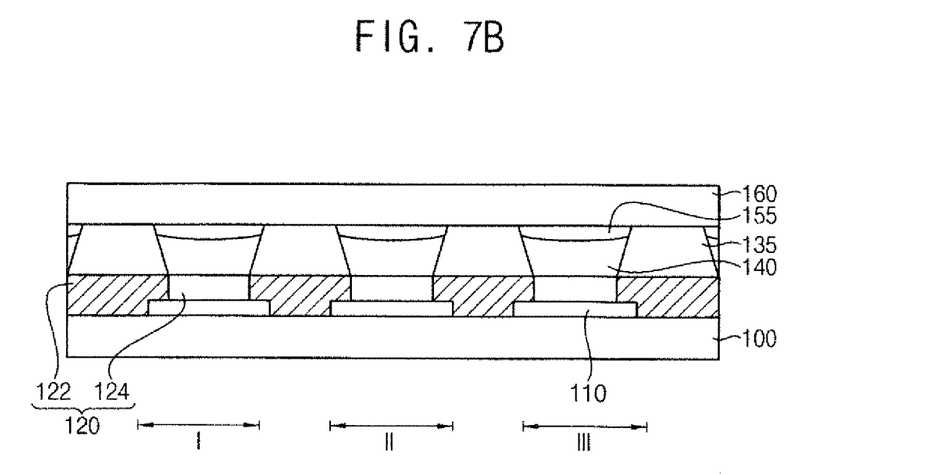

The PDL 135 (shown in FIG. 4A) obtained by the selective exposure process may have a surface energy substantially less than that of the preliminary PDL 130, an emitting layer 140 and a second organic layer 155 (see FIG. 7B). In exemplary embodiments, the PDL 135 may have a relatively small surface energy less than about 50 dyne/cm$^2$, preferably less than about 20 dyne/cm$^2$.

Figure 4A:
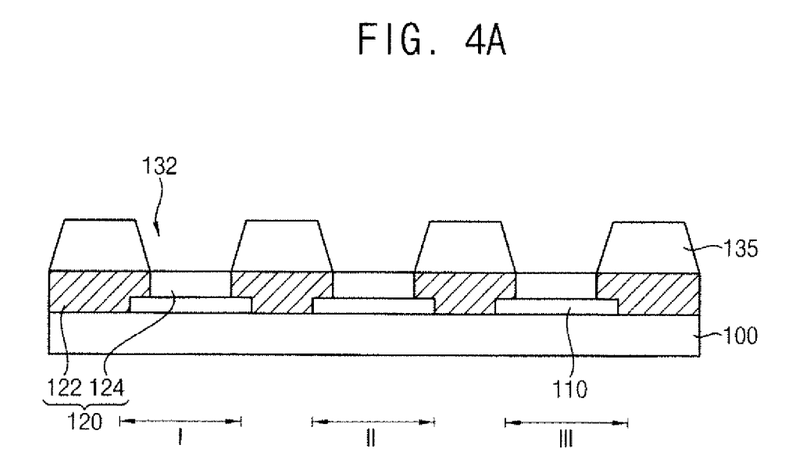
Figure 4B:
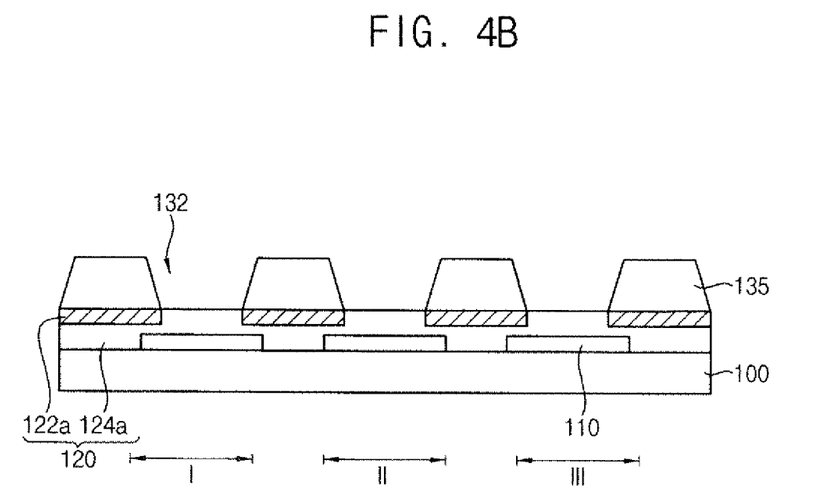

Referring to FIG. 4A, the first organic layer 120 may be divided into a first organic layer pattern 122 and a second organic layer pattern 124 by the above selective exposure process. The ultraviolet or laser light irradiated through the transparent portion 12 of the mask 10 (of FIG. 3) may transform the preliminary PDL 130 into the PDL 135, and additionally transform a portion of the first organic layer 120 beneath the PDL 135 into the first organic layer pattern 122 (FIG. 4A). A remaining portion except for the first organic layer pattern 122 may be defined as the second organic layer pattern 124.

As illustrated in FIG. 4A, a portion of the first organic layer 120 overlapping the PDL 135 may be entirely transformed into the first organic layer pattern 122 so as to make contact with the first electrode 110. However, referring to FIG. 4B, the portion of the first organic layer 120 overlapping the PDL 135 may be partially transformed into a first organic layer pattern 122a beneath the PDL 135. The first organic layer pattern 122a may be formed over the first electrode 110, and a remaining portion of the first organic layer 120 may be defined as a second organic layer pattern 124a.

In exemplary embodiments, the first organic layer patterns 122 and 122a may have surface properties and/or chemical properties different from those of the second organic layer patterns 124 and 124a. The portion of the first organic layer 120 beneath the PDL 135 may be chemically modified by the light irradiated through the transparent portion 12 of the mask 10 of FIG. 3. For example, molecular structures or bonding characteristics of the hole transport material or the hole injection material included in the first organic layer 120 may be changed or modified. Thus, the first organic layer patterns 122 and 122a may have decreased hole transport or hole injection capabilities. The first organic layer patterns 122 and 122a may also have electrical conductivities less than those of the second organic layer patterns 124 and 124a. Accordingly, lateral diffusion of charges from the pixel regions I, II and III may be prevented, and regions in which holes are moved or transferred may be precisely confined or limited. As a result, the organic light emitting structure may have improved resolution and contrast.

Figure 5A:
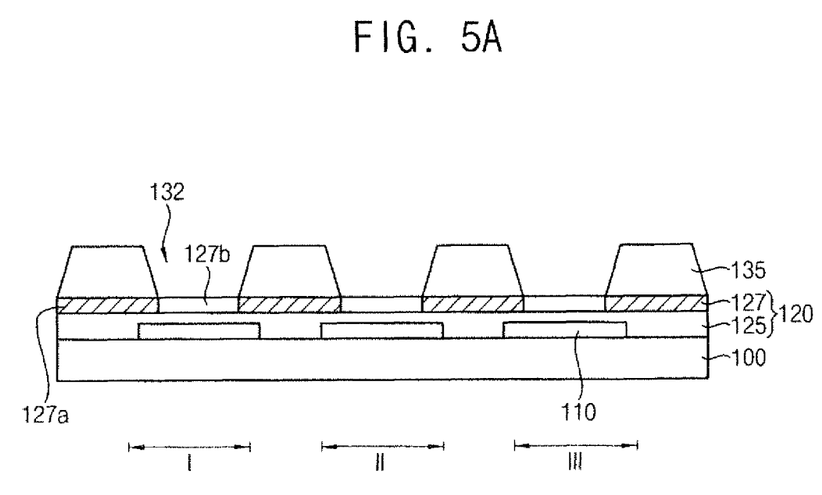

As illustrated in FIG. 5A, the first organic layer 120 may include a hole injection layer (HIL) 125 and a hole transport layer (HTL) 127 sequentially stacked on the substrate 100 and the first electrode 110.

In exemplary embodiments, the PDL 135 may be formed from the preliminary PDL 130 including the above described photosensitive material and the photoinitiator, and the HTL 127 may include the above described hole transport material and the photosensitive monomer. In this case, the active species generated by the photoinitiator of the preliminary PDL 130 during the selective exposure process may be diffused into a portion of the HTL 127 beneath the preliminary PDL 130. Accordingly, the photosensitive monomer of the HTL 127 may be cross-linked or polymerized to form a first HTL pattern 127a beneath the PDL 135. A remaining portion of the HTL 127, except for the first HTL pattern 127a, may be defined as a second HTL pattern 127b. The first HTL pattern 127a may include a polymer produced by the photosensitive monomer. Thus, the first HTL pattern 127a may have a hole transport capability or an electrical conductivity less than those of the second HTL pattern 127b.

In exemplary embodiments, the first HTL pattern 127a and the second HTL layer pattern 127b may substantially overlap the non-pixel regions and the pixel regions I, II and III, respectively. The first HTL pattern 127a may partially overlap the first electrode 110.

In some exemplary embodiments, the HTL 127 may further include the photoinitiator in addition to the hole transport material and the photosensitive monomer. In this case, active species such as radicals may be generated by the photoinitiator of the HTL 127 during the selective exposure process so as to induce cross-linking and/or polymerization reactions of the photosensitive monomer. When the HTL 127 includes the photoinitiator, the preliminary PDL 130 may not include the photoinitiator.

Figure 5B:
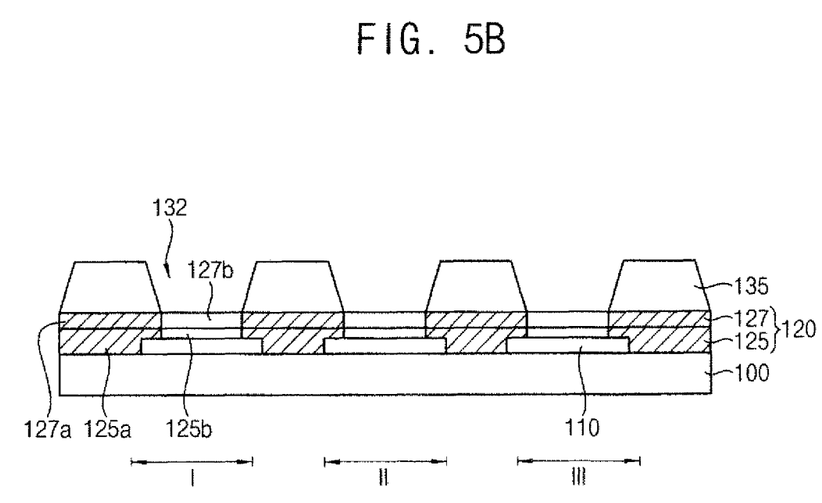

Referring to FIG. 5B, the HIL 125 may also include the above described photosensitive monomer in addition to the hole injection material. In this case, the active species generated by the photoinitiator of the preliminary HTL 130 and/or the HTL 127 may be diffused into the HIL 125 so as to induce cross-linking and/or polymerization reactions of the photosensitive monomer of the HIL 125. Accordingly, a portion of the HIL 125 beneath the first HTL pattern 127a may be transformed into a first HIL pattern 125a. A remaining portion of the HIL 125, except for the first HIL pattern 125a, may be defined as a second HIL pattern 125b. The first HIL pattern 125a may include a polymer produced by the photosensitive monomer, and thus the first HIL pattern 125a may have a hole injection capability or an electrical conductivity less than those of the second HIL pattern 125b.

In exemplary embodiments, the first HIL pattern 125a and the second HIL layer pattern 125b may substantially overlap the non-pixel regions and the pixel regions I, II and III, respectively. The first HIL pattern 125a may partially overlap the first electrode 110.

In some exemplary embodiments, the HIL 125 may further include a photoinitiator in addition to the hole injection material and the photosensitive monomer. In this case, active species such as radicals may be generated by the photoinitiator of the HIL 125 during the selective exposure process so as to induce cross-linking and/or polymerization reactions of the photosensitive monomer. When the HIL 125 includes the photoinitiator, the HTL 127 may not include the photoinitiator.

Hereinafter, subsequent processes will be described with reference to the resultant structure illustrated in FIG. 6.

Figure 6:
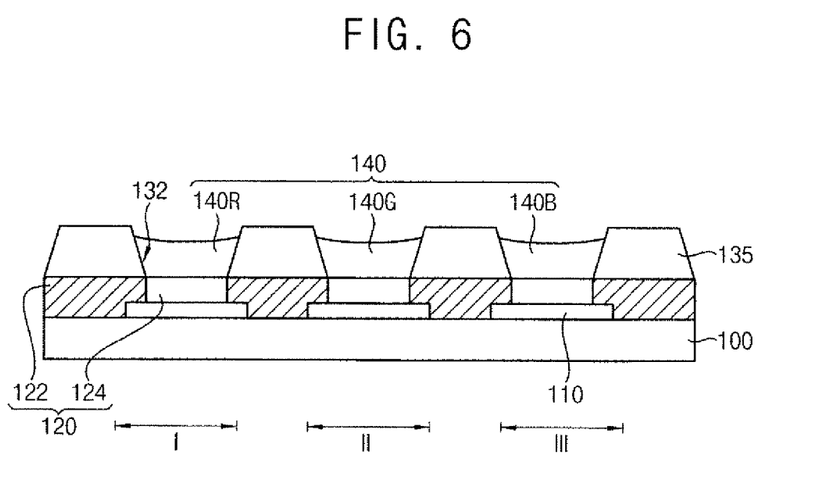

Referring to FIG. 6, an emitting layer (EML) 140 may be formed in each of the pixel regions I, II and III defined by the PDL 135. The EML 140 may partially fill the openings 132. In exemplary embodiments, the EML 140 may be formed on a sidewall of the PDL 135 and on the second organic layer pattern 124 of the first organic layer 120. In some exemplary embodiments, the first organic layer pattern 122 may be partially exposed by the PDL 135. In this case, the EML 140 may be formed on the sidewall of the PDL 135, and on the second organic layer pattern 124 and the exposed first organic layer pattern 122.

In exemplary embodiments, the pixel regions I, II and III may correspond to red (R), green (G) and blue (B) pixel regions, respectively. In this case, the EML 140 may include a red EML 140R, a green EML 140G and a blue EML 140B. The EML 140 may be formed using suitable light emitting materials for generating a red color of light, a green color of light or a blue color of light in accordance with a light-emitting mechanism of the EML 140, for example, a fluorescent mechanism or a phosphorescent mechanism. In some exemplary embodiments, the EML 140 may be formed using a mixture of the light emitting materials for generating a white color of light. The light emitting materials may serve as dopant materials of the EML 140, and the EML 140 may further include host materials having a relatively large band gap. The EML 140 may be obtained by a printing process including inkjet, spin or nozzle printing processes, a transfer process using a donor substrate by heat or laser, etc.

According to exemplary embodiments, the PDL 135 may include the photosensitive material cured or hardened by the selective exposure process so as to have a relatively low surface energy. Furthermore, the first organic layer 120 including the HTL 127 and/or the HIL 125 of FIGS. 5A and 5B may be formed prior to forming the PDL 135 on the first organic layer 120 of FIG. 6. Thus, only the EML 140 may make contact with the sidewall of the PDL 135. Therefore, deviations or irregularities of luminescence characteristics near the sidewall of the PDL 135, occurring when a plurality of layers is formed on the PDL 135, may be prevented or minimized. Furthermore, the first organic layer pattern 122 having a relatively low electrical conductivity and/or hole transport or hole injection capabilities may be formed beneath the PDL 135. Therefore, crosstalk between the adjacent pixel regions, or between the pixel region and the non-pixel region, may be efficiently blocked.

Referring to FIG. 7A, a second organic layer 150 may be formed on the PDL 135 and the EML 140. A second electrode 160 may be formed on the second organic layer 150.

The second organic layer 150 may substantially fill the opening 132 of FIG. 5B, and may be entirely deposited or coated over the substrate 100. The second organic layer 150 may be obtained by a vacuum evaporation process, a thermal evaporation process, a slit coating process, a spin coating process, a printing process, etc.

The second organic layer 150 may include an electron transport layer (ETL). The ETL may be formed using, e.g., tris(8-quinolinolato)aluminum (III) (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), etc. These may be used alone or in a mixture thereof.

The second organic layer 150 may further include an electron injection layer (EIL) on the ETL. The EIL may be formed using an alkaline metal, an alkaline earth metal, fluorides of these metals, oxides of these metals, etc. These may be used alone or in a mixture thereof.

The second electrode 160 may be formed using a transparent conductive material or a metal according to the types thereof, for example, a transparent electrode or a reflective electrode. The transparent conductive material may include ITO, ZTO, IZO, $ZnO_x$, $SnO_x$, GIZO, AZO, etc. The metal may include, e.g., Ag, Al, Pt, Au, Cr, W, Mo, Ti, Pd, etc., or an alloy of these materials. The second electrode 160 may be obtained by a sputtering process, a chemical vapor deposition (CVD) process, an atomic layer deposition (ALD) process, a vacuum deposition process, a printing process, etc. In one exemplary embodiment, the second electrode 160 may have a multi-stacked structure including a first layer and a second layer. The first layer may include, e.g., the above metal or the alloy, and the second layer may include, e.g., the above transparent conductive material. The second electrode 160 may serve as a cathode providing electrons into the second organic layer 150.

As illustrated in FIG. 7B, a second organic layer 155 may be selectively formed in each of the pixel regions I, II and III. For example, the second organic layer 155 may be formed only on the EML 140 and the sidewall of the PDL 135. In this case, the second organic layer 155 may be obtained by a printing process including inkjet, spin, nozzle printing processes, etc., or a transfer process using a donor substrate by heat or laser. The second electrode 160 may be formed on the PDL 135 and the second organic layer 155.

FIGS. 8 through 12, 13A, 13B, 14A and 14B are cross-sectional views illustrating a method of manufacturing an organic light emitting display device in accordance with exemplary embodiments of the invention. In the exemplary embodiments, the OLED device may include a lower structure, an organic light emitting structure and an upper structure.

Figure 8:
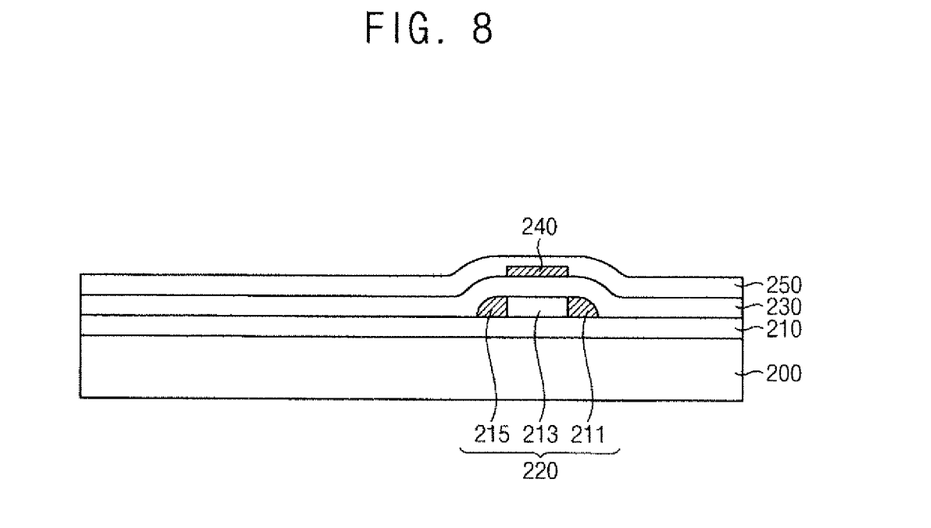
FIGS. 8 through 12, 13A, 13B, 14A and 14B are cross-sectional views illustrating a method of manufacturing an organic light emitting display device in accordance with the exemplary embodiments of the invention.
Figure 9:
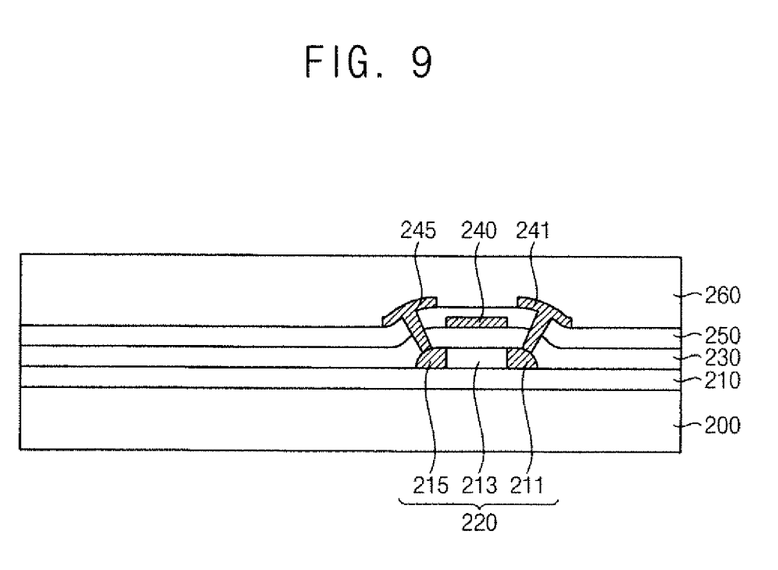

FIGS. 8 and 9 are cross-sectional views illustrating a method of forming the lower structure of the OLED device. For example, the lower structure may include a switching device that may have a thin film transistor (TFT).

Referring to FIG. 8, a semiconductor pattern 220, a gate insulation layer 230 and a gate electrode 240 may be formed on a lower substrate 200.

In exemplary embodiments, a buffer layer 210 may be formed on the lower substrate 200. The lower substrate 200 may include a transparent insulating substrate, for example, a glass substrate, a quartz substrate, a ceramic substrate, a transparent plastic substrate, etc. The buffer layer 210 may prevent a diffusion of impurities and may planarize an upper surface of the lower substrate 200. The buffer layer 210 may be formed using silicon oxide, silicon nitride, silicon oxynitride, etc. The buffer layer 210 may be obtained by a CVD process, a plasma enhanced chemical vapor deposition (PECVD) process, a high density plasma-chemical vapor deposition (HDP-CVD) process, a spin coating process, etc. Alternatively, the buffer layer 210 may be formed by performing a thermal oxidation process on the lower substrate 200. In some exemplary embodiments, the buffer layer 210 may not be formed on the lower substrate 200.

The switching device, including the semiconductor pattern 220, the gate insulation layer 230 and the gate electrode 240, may be formed on the buffer layer 210. In exemplary embodiments, a preliminary semiconductor pattern (not illustrated) may be formed on the buffer layer 210, and the gate insulation layer 230 covering the preliminary semiconductor pattern may be formed on the buffer layer 210. The preliminary semiconductor pattern may be formed using, e.g., polysilicon or amorphous silicon by a sputtering process, a CVD process, a low pressure chemical vapor deposition (LPCVD) process, a vacuum evaporation process, etc. A crystallization process including, e.g., an annealing process or a laser treatment may be performed on the preliminary semiconductor pattern. In one exemplary embodiment, a heat treatment may be further performed on the preliminary semiconductor pattern to remove hydrogen therefrom.

The gate insulation layer 230 may be formed using, e.g., silicon oxide or a metal oxide. The gate insulation layer 230 may be obtained by a CVD process, a PECVD process, a sputtering process, a vacuum evaporation process, etc. The gate insulation layer 230 may have a single-layered structure or a multi-layered structure including silicon oxide and/or the metal oxide.

The gate electrode 240 may be formed on the gate insulation layer 230. The gate electrode 240 may be formed using, e.g., a metal, a metal nitride, a conductive metal oxide, a transparent conductive material. For example, a first conductive layer (not illustrated) may be formed on the gate insulation layer 230 by a sputtering process, a CVD process, an ALD process, a pulse laser deposition (PLD) process, or a printing process, and then the first conductive layer may be patterned by, e.g., an etching process to obtain the gate electrode 240. A gate line (not illustrated) that may extend on the gate insulation layer 230 and be electrically connected to the gate electrode 240 may be formed together with the gate electrode 240.

Impurities may be implanted into the preliminary semiconductor pattern using the gate electrode 240 as an ion-implantation mask. Accordingly, a source region 211 and a drain region 215 may be formed at both lateral portions of the preliminary semiconductor pattern to obtain the semiconductor pattern 220. A portion of the semiconductor pattern 220 between the source region 211 and the drain region 215 may be defined as a channel region 213. The channel region 213 may substantially overlap the gate electrode 240 formed on the gate insulation layer 230.

Further referring to FIG. 8, a first insulating interlayer 250 covering the gate electrode 240 may be formed on the gate insulation layer 230. The first insulating interlayer 250 may be formed using, e.g., silicon oxide, silicon nitride, silicon oxynitride or a transparent insulating material. The first insulating interlayer 250 may be obtained by a CVD process, a PECVD process, a HDP-CVD process, a spin coating process, etc.

Referring to FIG. 9, a source electrode 241 and a drain electrode 245 electrically connected to the source region 211 and the drain region 215, respectively, may be formed. A second insulating interlayer 260 covering the source electrode 241 and the drain electrode 245 may be formed on the first insulating interlayer 250.

In exemplary embodiments, the first insulating interlayer 250 and the gate insulation layer 230 may be partially removed to form openings or holes, each of which may expose the source region 211 and the drain region 215. A second conductive layer sufficiently filling the openings or the holes may be formed on the first insulating interlayer 250, the source region 211 and the drain region 215. The second conductive layer may be patterned using a photoresist pattern or a mask pattern to form the source electrode 241 and the drain electrode 245 electrically connected to the source region 211 and the drain region 215, respectively. The second conductive layer may be formed using chromium, aluminum, tantalum, molybdenum, titanium, tungsten, copper, silver, neodymium, etc., or an alloy of these metals. The second conductive layer may be obtained by a sputtering process, a CVD process, an ALD process, a vacuum evaporation process, a printing process, etc. In exemplary embodiments, the source electrode 241 may be electrically connected to a data line (not illustrated) of the OLED device, and the drain electrode 245 may be electrically connected to a first electrode 270 (see FIG. 10).

The second insulating interlayer 260 may be formed using a transparent insulating material, e.g., acryl-based resin, polyimide-based resin, siloxane-based resin, BCB, etc. The second insulating interlayer 260 may be obtained by a spin coating process, a slit coating process, etc. In exemplary embodiments, the second insulating interlayer 260 may be formed using a material having a self-planarizing property. In one exemplary embodiment, a planarization process, including a chemical mechanical polishing (CMP) process and/or an etch-back process, may be performed on the second insulating interlayer 260 so that the second insulating interlayer 260 may have a substantially level surface.

By performing the above-described processes, the lower structure including the lower substrate 200 and the switching device may be obtained. As described above, the switching device may include the TFT including a semiconductor pattern 220, the gate insulation layer 230, the gate electrode 240, the source electrode 241 and the drain electrode 245. The TFT may be P-type or N-type metal oxide semiconductor (MOS) transistors according to the types of the impurities implanted into the preliminary semiconductor pattern. In some exemplary embodiments, the switching device may include an oxide semiconductor device. For example, a gate electrode and a gate insulation layer may be formed on the lower substrate 200, and an active layer may be formed on the gate insulation layer using a semiconductor oxide.

Hereinafter, subsequent processes will be described in the case wherein the switching device including the TFT is formed on the lower substrate 200 as illustrated in FIG. 9.

FIGS. 10 through 12, 13A, 13B, 14A and 14B are cross-sectional views illustrating a method of forming the organic light emitting structure on the lower structure obtained by the processes illustrated with reference to FIGS. 8 and 9.

In exemplary embodiments, the organic light emitting structure may be formed on the lower structure by processes substantially the same as, or similar to, those illustrated with reference to FIGS. 1 through 3, 4A, 4B, 5A, 5B, 6, 7A and 7B. Thus, like reference numerals may refer to like elements and detailed descriptions thereof are omitted.

Figure 10:
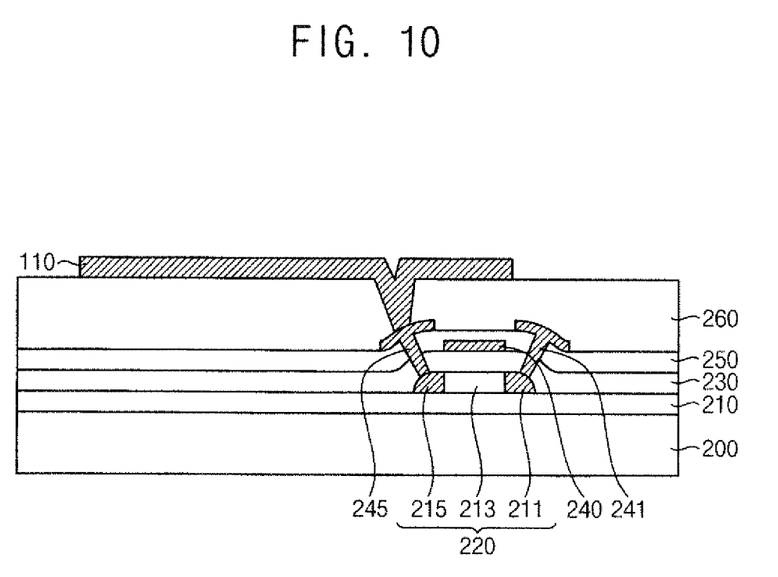

Referring to FIG. 10, a first electrode 110 electrically connected to the drain electrode 245 may be formed on the second insulating interlayer 260. In exemplary embodiments, the second insulating interlayer 260 may be partially removed to form a contact hole (not illustrated) exposing at least a portion of the drain electrode 245. A third conductive layer (not illustrated) sufficiently filling the contact hole may be formed on the second insulating interlayer 260 and the drain electrode 245. The third conductive layer may be patterned to form the first electrode 110. The third conductive layer may be formed using a transparent conductive material including, e.g., ITO, ZTO, IZO, $ZnO_x$, $SnO_x$, GIZO, AZO, etc., or a metal including, e.g., Ag, Al, Pt, Au, Cr, W, Mo, Ti, Pd, etc., or an alloy of these materials. The third conductive layer may be obtained by a sputtering process, a CVD process, an ALD process, a vacuum evaporation process, a printing process, etc. The first electrode 110 may serve as an anode providing holes. In one exemplary embodiment, the first electrode 110 may have a multi-layered structure including a transparent conductive material layer and a metal layer.

Figure 11:
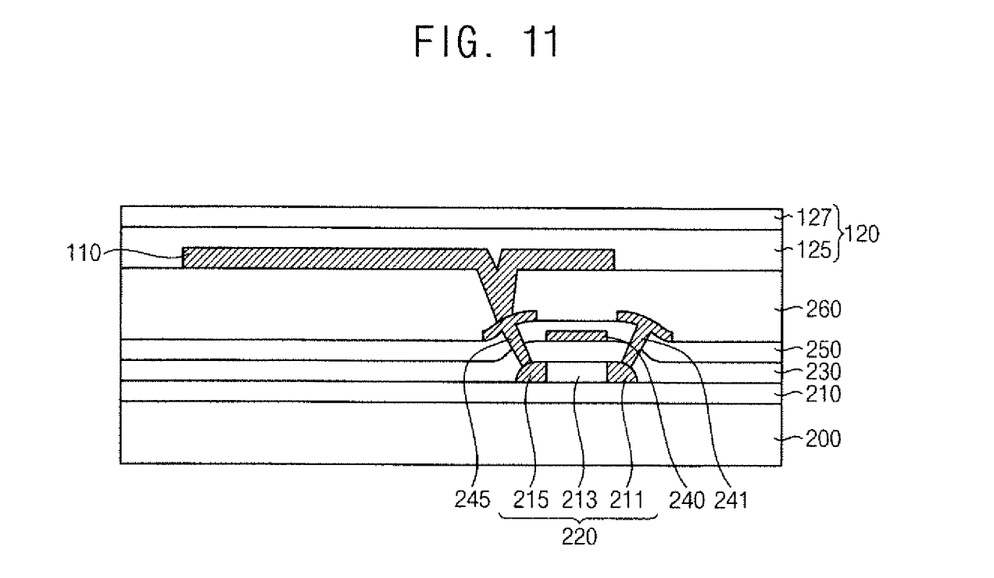

Referring to FIG. 11, a first organic layer 120 covering the first electrode 110 may be formed on the second insulating interlayer 260. The first organic layer 120 may be deposited or coated on a whole surface of the second insulating interlayer 260 by a spin coating process, a roll coating process, a vacuum evaporation process, or a thermal evaporation process.

In exemplary embodiments, the first organic layer 120 may include a HTL 127. The first organic layer 120 may further include a HIL 125 beneath the HTL 127. Hereinafter, subsequent processes in the case wherein the first organic layer 120 includes both the HIL 125 and the HTL 127 sequentially stacked on the second insulating interlayer 260 and the first electrode 110 are described.

The HIL 125 may be formed using the above-mentioned hole injection material. In some exemplary embodiments, the HIL 125 may be formed using a mixture of the hole injection material, the above-mentioned photoinitiator and/or the above-mentioned photosensitive monomer.

The HTL 127 may be formed using the above-mentioned hole transport material. In some exemplary embodiments, the HTL 127 may be formed using a mixture of the hole transport material, the photoinitiator and/or the photosensitive monomer.

Figure 12:
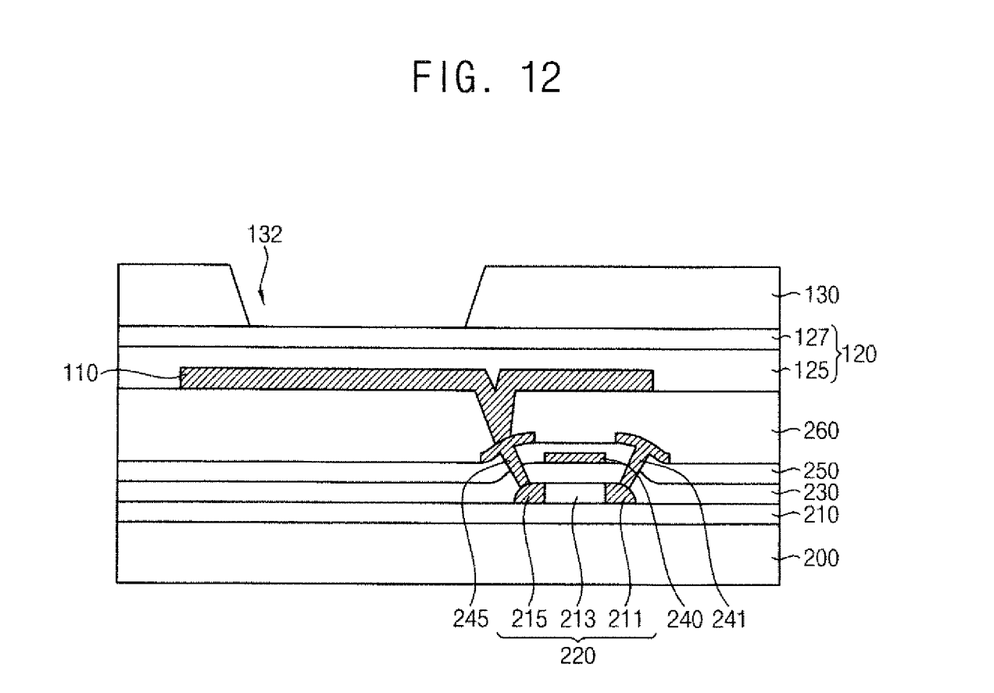

Referring to FIG. 12, a process substantially the same as, or similar to, that illustrated with reference to FIG. 2 may be performed to form a preliminary PDL 130 on the HTL 127. In exemplary embodiments, the preliminary PDL 130 may substantially overlap both lateral portions of the first electrode 110. As described above, the preliminary PDL 130 may be formed using the photosensitive material or precursors of the photosensitive material. In some exemplary embodiments, the preliminary PDL 130 may be formed using a mixture of the photosensitive material and the photoinitiator. An opening 132 partially exposing the HTL 127 may be defined by the preliminary PDL 130.

Figure 13A:
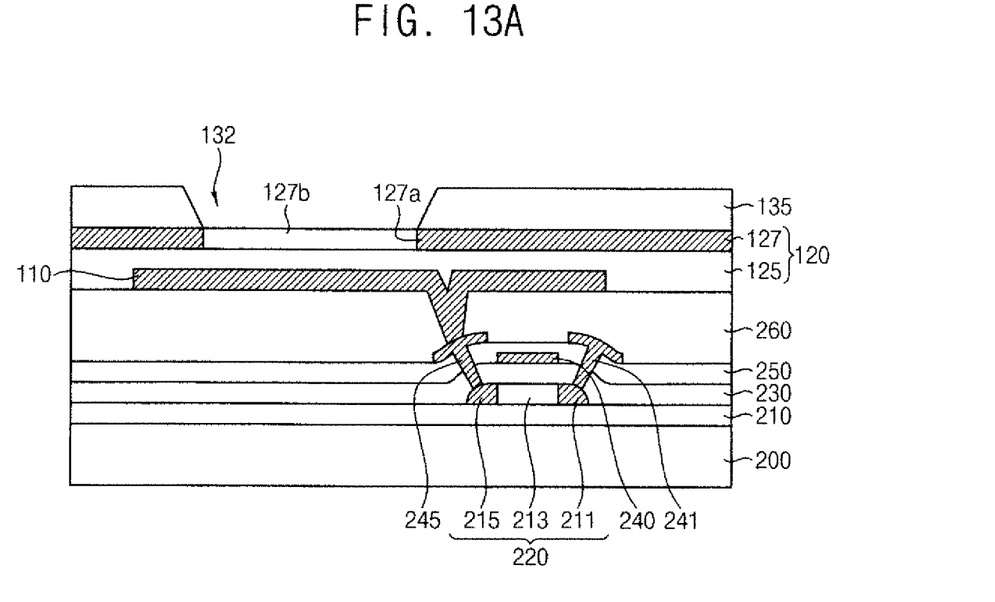

Referring to FIG. 13A, a process substantially the same as, or similar to, that illustrated with reference to FIG. 3 may be performed to form a PDL 135 from the preliminary PDL 130. In exemplary embodiments, a selective exposure process may be performed on the preliminary PDL 130 to form the PDL 135 including the cured or hardened photosensitive material. The PDL 135 may have a surface energy less than those of the preliminary PDL 130, an EML 140 and a second organic layer 155 (see FIG. 14A) by the selective exposure process. In exemplary embodiments, the PDL 135 may have a surface energy less than about 50 $dyne/cm^2$, preferably less than about 20 $dyne/cm^2$.

In the case wherein the preliminary PDL 130 includes the photoinitiator, active species including, e.g., radicals generated by the photoinitiator of the preliminary PDL 130 may be diffused into the HTL 127. Accordingly, a portion of the HTL 135 beneath the PDL 135 may be transformed by the active species into a first HTL pattern 127*a* having a reduced hole transport capability. When the HTL 127 includes the photosensitive monomer, the first HTL pattern 127a may include a polymer produced by cross-linking or polymerization reactions of the photosensitive monomer, and thus the first HTL pattern 127a may have a reduced electrical conductivity. A remaining portion of the HTL 127, except for the first HTL 127a pattern, may be defined by a second HTL pattern 127b. In exemplary embodiments, the second HTL pattern 127b may have a hole transport capability and/or an electrical conductivity substantially greater than those of the first HTL pattern 127b.

In the case wherein the HTL 127 includes the photoinitiator, the active species may be generated by the HTL 127 to form the first HTL pattern 127a beneath the PDL 135, even though the preliminary PDL 130 does not include the photoinitiator.

Figure 13B:
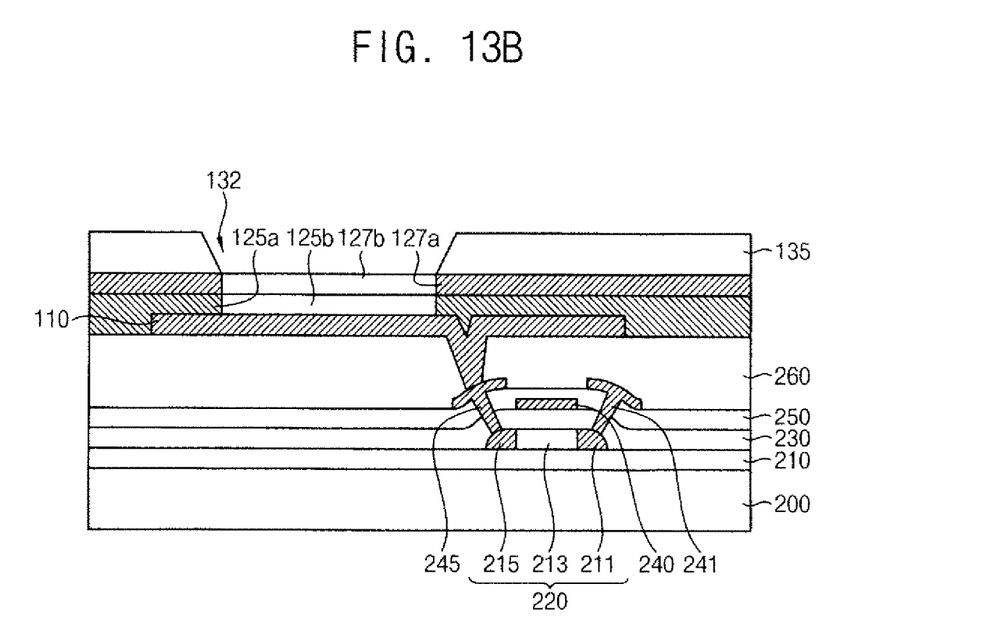

Referring to FIG. 13B, the active species generated by the preliminary PDL 130 and/or the HTL 127 may be further diffused into the HIL 125. Accordingly, a portion of the HIL 125 beneath the first HTL pattern 127a may be transformed into a first HIL pattern 125a. A remaining portion of the HIL 125, except for the first HIL pattern 125a, may be defined as a second HIL pattern 125b. When the HIL 125 includes the photosensitive monomer, the first HIL pattern 125a may include a polymer produced by cross-linking or polymerization reactions of the photosensitive monomer, and thus the first HIL pattern 125a may have a reduced electrical conductivity. In exemplary embodiments, the first HIL pattern 125a may have a hole injection capability and/or an electrical conductivity substantially less than those of the second HIL pattern 125b.

In the case wherein the HIL 125 includes the photoinitiator, the active species may be generated by the HIL 125 so as to form the first HIL pattern 125a beneath the first HTL pattern 127a even though the preliminary PDL 130 and/or the HTL 127 do not include the photoinitiator.

Hereinafter, subsequent processes are described in the case wherein both the first HTL pattern 127a and the first HIL pattern 125a are formed.

Figure 14A:
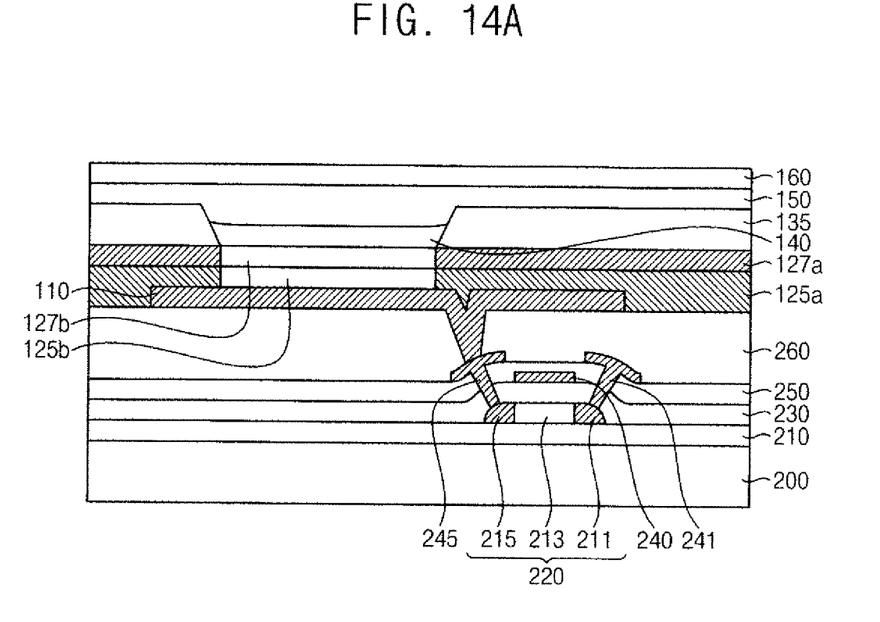

Referring to FIG. 14A, a process substantially the same as, or similar to, that illustrated with reference to FIG. 7A may be performed to form an EML 140 on a sidewall of the PDL 135 and on the second HTL pattern 127b exposed by the opening 132.

A second organic layer 150 may be formed on the EML 140 and the PDL 135. A second electrode 160 may be formed on the second organic layer 150. In exemplary embodiments, the EML 140 may partially fill the opening 132. The second organic layer 150 may fill up a remaining portion of the opening 132, and may be coated or deposited entirely over the lower substrate 200. The second organic layer 150 may include an ETL or may further include an EIL on the ETL.

In some exemplary embodiments, the first HTL pattern 127a may be partially exposed by the opening 132. In this case, the EML 140 may be formed on the second HTL pattern 127b and the exposed first HTL pattern 127a. The second electrode 160 may serve as a cathode providing electrons.

Figure 14B:
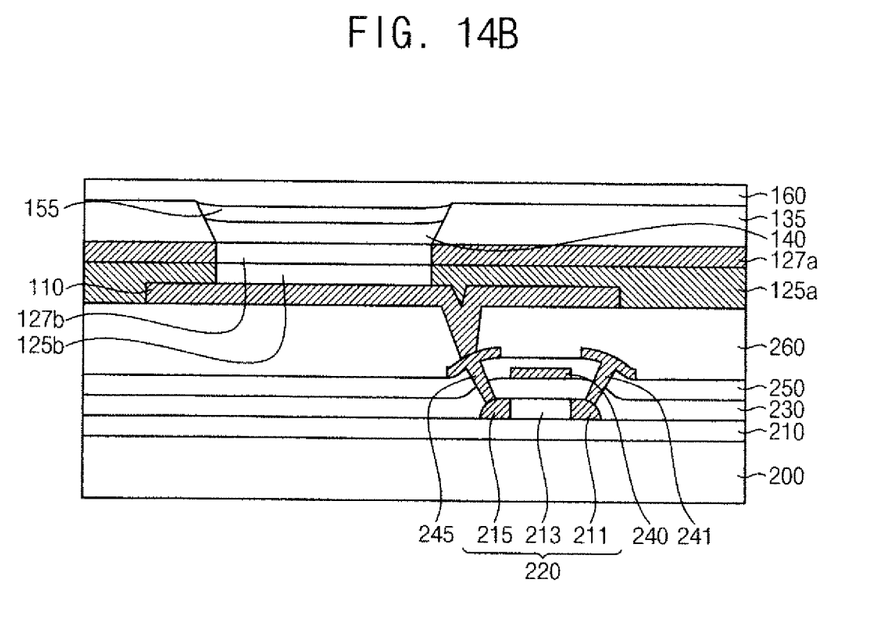

Referring to FIG. 14B, a second organic layer 155 may not be formed on a top surface of the PDL 135. For example, the second organic layer 155 may be selectively formed inside the opening 132. In this case, the second organic layer 155 and the EML 140 may be confined or limited by the PDL 135. The second electrode 160 may be formed on the PDL 135 and the second organic layer 155.

By performing the above-described processes, the organic light emitting structure including the first electrode 110, the first organic layer 120, the PDL 135, the EML 140, the second organic layer 150 and the second electrode 160 formed on the lower structure may be obtained.

An upper structure including, e.g., a protection layer (not illustrated) and an upper substrate (not illustrated) may be formed on the organic light emitting structure to obtain the OLED device according to exemplary embodiments. The protection layer may be formed using a transparent insulating material and the upper substrate may include a transparent insulating substrate.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of forming an organic light emitting structure, comprising the steps of:
    forming a plurality of first electrodes spaced apart from each other on a lower substrate;
    forming a first organic layer covering the first electrodes on the lower substrate;
    forming a preliminary pixel defining layer on the first organic layer, the preliminary pixel defining layer including a photosensitive material;
    selectively exposing the preliminary pixel defining layer to light so that the preliminary pixel defining layer and a portion of the first organic layer beneath the preliminary pixel defining layer are transformed into a pixel defining layer and a first organic layer pattern, respectively;
    forming an emitting layer on the first organic layer exposed by the pixel defining layer;
    forming a second organic layer on the emitting layer; and
    forming a second electrode on the second organic layer.

2. The method of claim 1,
    wherein a remaining portion of the first organic layer, except for the first organic layer pattern, is defined as a second organic layer pattern; and
    wherein the first organic layer pattern has hole transport capability or hole injection capability less than those of the second organic layer pattern.

3. The method of claim 1, wherein the preliminary pixel defining layer further includes a photoinitiator.

4. The method of claim 3, wherein the first organic layer pattern is formed by active species that are generated by the photoinitiator and diffused to the first organic layer.

5. The method of claim 4, wherein the first organic layer pattern includes a polymer cross-linked or polymerized by the active species.

6. The method of claim 1,
    wherein the photosensitive material of the preliminary pixel defining layer is cured or hardened to form the pixel defining layer; and wherein the pixel defining layer has a surface energy less than those of the preliminary pixel defining layer, the first organic layer, the emitting layer and the second organic layer.

7. A method of forming an organic light emitting structure, comprising the steps of:
forming a plurality of first electrodes spaced apart from each other on a lower substrate;
forming a hole transport layer covering the first electrodes on the lower substrate;
forming a preliminary pixel defining layer on the hole transport layer, the preliminary pixel defining layer including a photosensitive material;
selectively exposing the preliminary pixel defining layer to light so that the preliminary pixel defining layer and a portion of the hole transport layer beneath the preliminary pixel defining layer are transformed into a pixel defining layer and a first hole transport layer pattern, respectively;
forming an emitting layer on the hole transport layer exposed by the pixel defining layer;
forming an electron transport layer on the emitting layer; and
forming a second electrode on the electron transport layer.

8. The method of claim 7,
wherein a remaining portion of the hole transport layer, except for the first hole transport layer pattern, is defined as a second hole transport layer pattern; and
wherein the first hole transport layer pattern has a hole transport capability or an electrical conductivity less than those of the second hole transport layer pattern.

9. The method of claim 7, wherein at least one of the preliminary pixel defining layer and the hole transport layer includes a photoinitiator.

10. The method of claim 9,
wherein the hole transport layer includes a hole transport material and a photosensitive monomer; and
wherein the first hole transport layer pattern includes a polymer produced by a cross-linking reaction of the photosensitive monomer or a polymerization reaction of the photosensitive monomer, the cross-linking reaction or the polymerization reaction being induced by active species generated by the photoinitiator.

11. The method of claim 9, further comprising the step of forming a hole injection layer before forming the hole transport layer;
wherein a portion of the hole injection layer beneath the first hole transport layer pattern is transformed into a first hole injection layer pattern.

12. The method of claim 11,
wherein the hole injection layer includes a hole injection material and a photosensitive monomer; and
wherein the first hole injection layer pattern includes a polymer produced by a cross-linking reaction of the photosensitive monomer or a polymerization reaction of the photosensitive monomer, the cross-linking reaction or the polymerization reaction being induced by active species generated by the photoinitiator.

13. The method of claim 12,
wherein a remaining portion of the hole injection layer, except for the first injection layer pattern, is defined as a second injection layer pattern; and
wherein the first hole injection layer pattern has a hole injection capability or an electrical conductivity less than those of the second injection layer pattern.

14. The method of claim 11,
wherein the hole injection layer includes a hole injection material and a photoinitiator; and
wherein the first hole injection layer pattern includes active species generated by the photoinitiator.

15. A method of manufacturing an organic light emitting display device, comprising the steps of:
forming a lower structure on a lower substrate, the lower structure including a switching device and an insulation layer;
forming a first electrode electrically connected to the switching device on the lower structure;
forming a first organic layer covering the first electrode on the lower structure;
forming a preliminary pixel defining layer on the first organic layer, the preliminary pixel defining layer including a photosensitive material;
selectively exposing the preliminary pixel defining layer to light so that the preliminary pixel defining layer and a portion of the first organic layer beneath the preliminary pixel defining layer are transformed into a pixel defining layer and a first organic layer pattern, respectively;
forming an emitting layer on the first organic layer exposed by the pixel defining layer;
forming a second organic layer on the emitting layer; and
forming a second electrode on the second organic layer.

16. The method of claim 15, wherein at least one of the preliminary pixel defining layer and the first organic layer includes a photoinitiator.

17. The method of claim 16,
wherein the first organic layer includes a hole transport material and a photosensitive monomer; and
wherein the first organic layer pattern includes a polymer produced by a cross-linking reaction of the photosensitive monomer or a polymerization reaction of the photosensitive monomer, the cross-linking reaction or the polymerization reaction being induced by active species generated by the photoinitiator.

18. The method of claim 17,
wherein a remaining portion of the first organic layer, except for the first organic layer pattern, is defined as a second organic layer pattern; and
wherein the first organic layer pattern has a hole transport capability or an electrical conductivity less than those of the second organic layer pattern.

19. The method of claim 15,
wherein the second organic layer includes an electron transport layer; and
wherein the electron transport layer is formed on the emitting layer and a sidewall of the pixel defining layer, and the electron transport layer is not formed on a top surface of the pixel defining layer.

20. The method of claim 15, wherein the second organic layer includes an electron transport layer; and
wherein the electron transport layer covers the pixel defining layer and the emitting layer.

21. The method of claim 15, wherein the switching device includes one of a thin film transistor and an oxide semiconductor device.

22. The method of claim 15,
wherein the photosensitive material of the preliminary pixel defining layer is cured or hardened to form the pixel defining layer; and
wherein the pixel defining layer has a surface energy less than those of the preliminary pixel defining layer, the first organic layer, the emitting layer and the second organic layer.

23. The method of claim 1,
wherein the second organic layer includes an electron transport layer; and
wherein the electron transport layer is formed on the emitting layer and a sidewall of the pixel defining layer, and the electron transport layer is not formed on a top surface of the pixel defining layer.

24. The method of claim 7,
wherein the second organic layer includes an electron transport layer; and
wherein the electron transport layer is formed on the emitting layer and a sidewall of the pixel defining layer, and the electron transport layer is not formed on a top surface of the pixel defining layer.

* * * * *